US010892354B2

(12) United States Patent
Alexander et al.

(10) Patent No.: US 10,892,354 B2
(45) Date of Patent: Jan. 12, 2021

(54) FIELD PLATES ON TWO OPPOSED SURFACES OF DOUBLE-BASE BIDIRECTIONAL BIPOLAR TRANSISTOR: DEVICES, METHODS, AND SYSTEMS

(71) Applicant: Ideal Power, Inc., Austin, TX (US)

(72) Inventors: William C. Alexander, Spicewood, TX (US); Richard A. Blanchard, Los Altos, CA (US)

(73) Assignee: Ideal Power Inc., Austin, TX (US)

( * ) Notice: Subject to any disclaimer, the term of this patent is extended or adjusted under 35 U.S.C. 154(b) by 0 days.

(21) Appl. No.: 16/773,031

(22) Filed: Jan. 27, 2020

(65) Prior Publication Data

US 2020/0243674 A1     Jul. 30, 2020

Related U.S. Application Data

(63) Continuation of application No. 16/557,284, filed on Aug. 30, 2019, now Pat. No. 10,580,885, which is a continuation of application No. 15/486,921, filed on Apr. 13, 2017, now Pat. No. 10,418,471, which is a continuation of application No. PCT/US2015/055388, filed on Oct. 13, 2015.

(60) Provisional application No. 62/063,090, filed on Oct. 13, 2014.

(51) Int. Cl.
| | |
|---|---|
| *H03K 17/66* | (2006.01) |
| *H01L 29/747* | (2006.01) |
| *H01L 29/40* | (2006.01) |
| *H01L 29/06* | (2006.01) |
| *H01L 29/10* | (2006.01) |
| *H01L 29/423* | (2006.01) |
| *H01L 29/732* | (2006.01) |
| *H01L 29/70* | (2006.01) |

(52) U.S. Cl.
CPC ........ *H01L 29/747* (2013.01); *H01L 29/0615* (2013.01); *H01L 29/0623* (2013.01); *H01L 29/0642* (2013.01); *H01L 29/1004* (2013.01); *H01L 29/404* (2013.01); *H01L 29/407* (2013.01); *H01L 29/42304* (2013.01); *H01L 29/732* (2013.01); *H01L 29/7325* (2013.01); *H03K 17/66* (2013.01); *H01L 29/705* (2013.01)

(58) Field of Classification Search
CPC . H01L 29/747; H01L 29/404; H01L 29/0623; H01L 29/0649; H01L 29/0642; H01L 29/407; H01L 29/1004; H01L 29/0615; H01L 29/7325; H01L 29/732; H01L 29/42304; H01L 29/705; H03K 17/66
See application file for complete search history.

(56) References Cited

U.S. PATENT DOCUMENTS

| | | | | |
|---|---|---|---|---|
| 5,040,042 | A * | 8/1991 | Bauer | H01L 29/7455 257/124 |
| 6,605,830 | B1 * | 8/2003 | Kusunoki | H01L 27/0664 257/133 |
| 2003/0042537 | A1 * | 3/2003 | Nakamura | H01L 29/402 257/328 |

\* cited by examiner

*Primary Examiner* — Stephen W Smoot
*Assistant Examiner* — Pavel G Ivanov
(74) *Attorney, Agent, or Firm* — Groover & Associates PLLC; Gwendolyn G. Corcoran; Robert O. Groover, III

(57) ABSTRACT

Dual-base two-sided bipolar power transistors which use an insulated field plate to separate the emitter/collector diffusions from the nearest base contact diffusion. This provides a surprising improvement in turn-off performance, and in breakdown voltage.

11 Claims, 6 Drawing Sheets

FIELD PLATES ON TWO OPPOSED SURFACES OF DOUBLE-BASE BIDIRECTIONAL BIPOLAR TRANSISTOR: DEVICES, METHODS, AND SYSTEMS

CROSS-REFERENCE

Priority is claimed from U.S. application 62/063,090, filed 13 Oct. 2014, which is hereby incorporated by reference.

In the United States, continuation-in-part priority is also claimed from copending PCT application WO2014/210072 (which designates the US), and therethrough to provisional U.S. application 61/838,578 filed 24 Jun. 2013, which is hereby incorporated by reference.

BACKGROUND

The present application relates to Double-Base Bidirectional Bipolar transistors, and more particularly to power transistors of the general type known as "B-TRANs."

Note that the points discussed below may reflect the hindsight gained from the disclosed inventions, and are not necessarily admitted to be prior art.

Published U.S. application US 2014-0375287 disclosed a fully bidirectional bipolar transistor, having emitter/collector regions on both faces of a semiconductor die, and also having base contact regions on both faces. In one group of embodiments (shown e.g. in FIG. 13A of that application, and described in paragraph [0083]), the emitter/collector regions are laterally separated from the base contact regions by a dielectric-filled trench. This reduces same-side carrier recombination in the ON state.

Application US 2014-0375287 also describes some surprising aspects of operation of the device. Notably: 1) when the device is turned on, it is preferably first operated merely as a diode, and base drive is then applied to reduce the on-state voltage drop. 2) Base drive is preferably applied to the base nearest whichever emitter/collector region will be acting as the collector (as determined by the external voltage seen at the device terminals). 3) A two-stage turnoff sequence is preferably used. 4) In the off state, base-emitter voltage (on each side) is limited by a low-voltage diode which parallels that base-emitter junction.

A somewhat similar structure was shown and described in application WO2014/122472 of Wood. However, that application is primarily directed to different structures. The Wood application also does not describe the methods of operation described in the US 2014-0375287 application. The Wood application also does not appear to describe lateral trench isolation between emitter/collector regions and base contact regions.

The present application provides improvements in structures of this type, in methods of operating such structures, and in systems which incorporate such structures.

The present application teaches, among other innovations, a symmetrically bidirectional dual-contact base bipolar junction transistor, in which both of the emitter/collector regions, which are present on both (opposed) surfaces of a semiconductor die, are surrounded by a field plate in a trench. This field plate separates the emitter/collector regions from adjacent base contact regions. Since base contact regions are present on both surfaces of the device, this structure improves the breakdown voltage of whichever base contact region is on the collector side, without degrading the characteristics of the base contact region on the other side. This provides surprising improvement in the breakdown voltage of a device like that of US 2014-0375287.

The present application also teaches, among other innovations, methods of operating structures of this type, and systems which incorporate structures of this type.

BRIEF DESCRIPTION OF THE DRAWINGS

The disclosed inventions will be described with reference to the accompanying drawings, which show important sample embodiments and which are incorporated in the specification hereof by reference, wherein.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

The class of fully bidirectional bipolar double-base transistors described in Published U.S. application US 2014-0375287 is now commonly referred to as a "B-TRAN." In some embodiments of that application, the emitter/collector regions are laterally separated from the base contact regions by a dielectric-filled trench. A B-TRAN is a three-layer four-terminal bidirectional bipolar transistor, as shown in the sample embodiment of FIG. 1. It is a symmetrical device, meaning that the polarity of the voltage on the two "end" terminals 102 and 104 determines which of these two terminals functions as the emitter (i.e., has a forward biased junction), and which of these terminals functions as the collector (i.e., has a reverse biased junction). It typically has a gain in the range of 5-20, and when biased "off," is capable of withstanding a high voltage in either direction. In addition, as a bipolar transistor, it has a minimum on-voltage ($V_{CE\text{-}SAT}$) that can be as low as 0.2 volts, which is well below the voltage drop of a junction diode (0.6 volts in silicon). Since the B-TRAN is symmetrical, it can be used in any circuit requiring a bi-directional switch. A device symbol that shows the symmetry of a B-TRAN is shown in FIG. 2.

A B-TRAN is in the "active off-state" when the e-base (base on emitter side) is shorted to the emitter, and the c-base (base on the collector side) is open. In this state with an NPN B-TRAN, the collector is the anode (high voltage side), and the emitter is the cathode (low voltage side).

The B-TRAN is also off when both bases are open, but due to the relatively high gain of the B-TRAN in this state, the breakdown voltage is low. The series combination of a normally-ON switch and a diode attached between each base and its respective emitter/collector, as disclosed elsewhere, will significantly increase the blocking voltage in this "passive off-state". The switches are turned off during normal operation.

Figure 3:
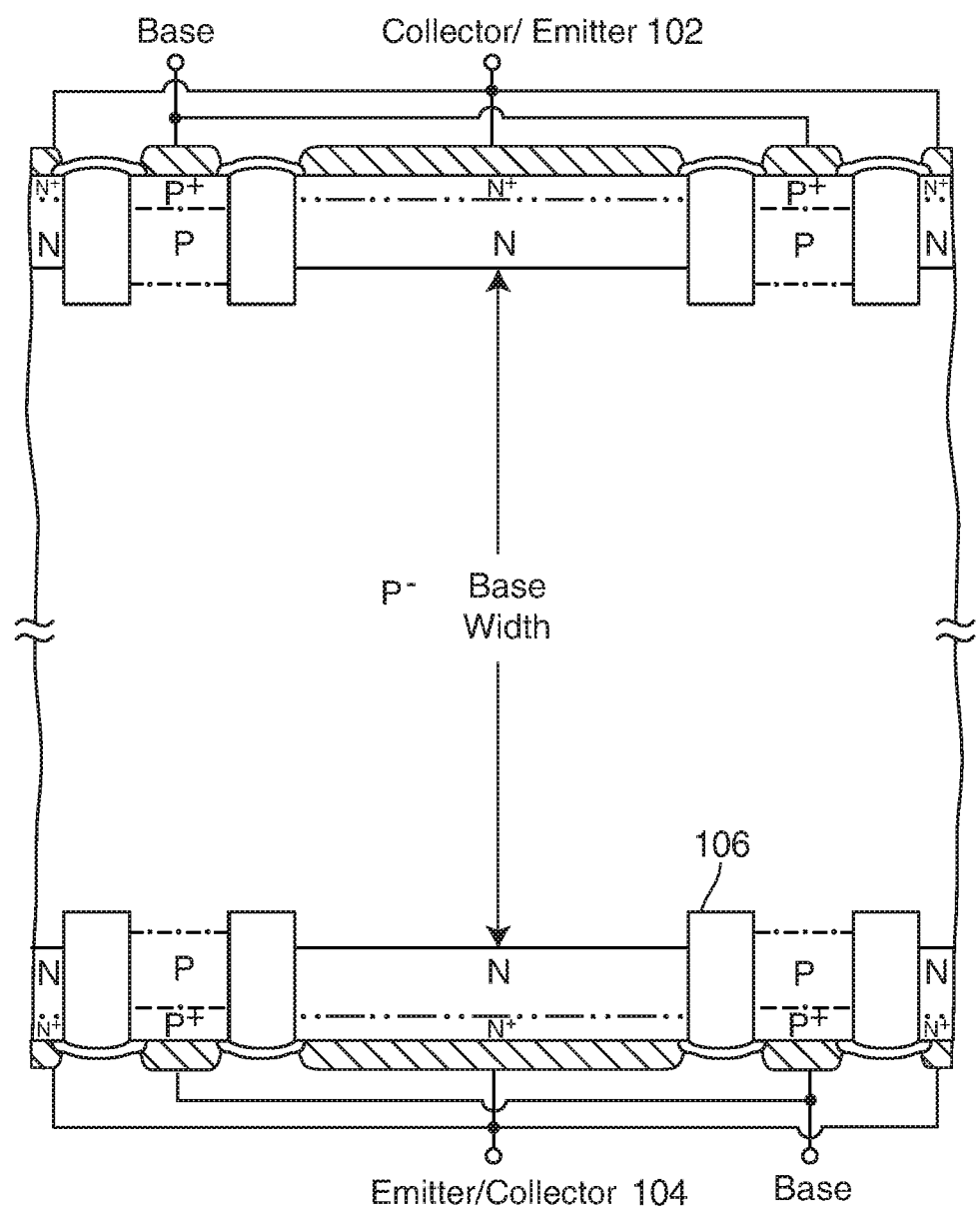
FIG. 3 schematically shows one sample embodiment of a B-TRAN having dielectric-filled trenches, as described in published application US 2014-0375287, which is hereby incorporated by reference.

FIG. 3 shows a fully symmetric bidirectional bipolar transistor, in which emitter/collector and base contact regions are separated by dielectric-filled trenches. This structure is described in published application US 2014-0375287. The example shown is an npn device, in which n-type emitter/collector regions are present on both front and back faces of a p-type semiconductor die. In addition, separate p-type base contact regions are provided on both front and back surfaces, to provide connection to the bulk of the p-type semiconductor material. In this structure the whole thickness of the semiconductor die can be regarded as the base, but the two base contact regions are electrically distinct, and are operated separately. (It will be noted that the words "die" and "substrate" are used interchanqeably throughout the instant application.)

As the B-TRAN devices are refined and improved, the present inventors have realized that a double-base bidirectional bipolar transistor presents several unique challenges. One of these is collector-base isolation. In normal bipolar junction transistors, the voltage difference between emitter and base is never very large; however, in a fully bidirectional bipolar transistor there are two emitter/collector terminals rather than a distinct emitter and collector. Whichever side is acting as the collector (due to the polarity of the externally applied voltage) will see a high electric field near the bottom of the emitter/collector diffusion on that side.

The requirement that the same physical structure be capable of functioning as either an emitter or a collector places significantly different requirements on the same junction at different times. For instance, when collector/emitter terminal 102 in FIG. 3 is acting as the collector, the reverse biased P-N junction at the top of the device must withstand the full voltage that is across the device. Simulations have shown, surprisingly, that the structure of FIG. 3, which uses insulator-filled trenches 106 to separate the n-type regions from the p-type regions, results in increased field intensity below the bottom of the insulation-filled trench, which decreases the withstand or breakdown voltage of the device.

Figure 1:
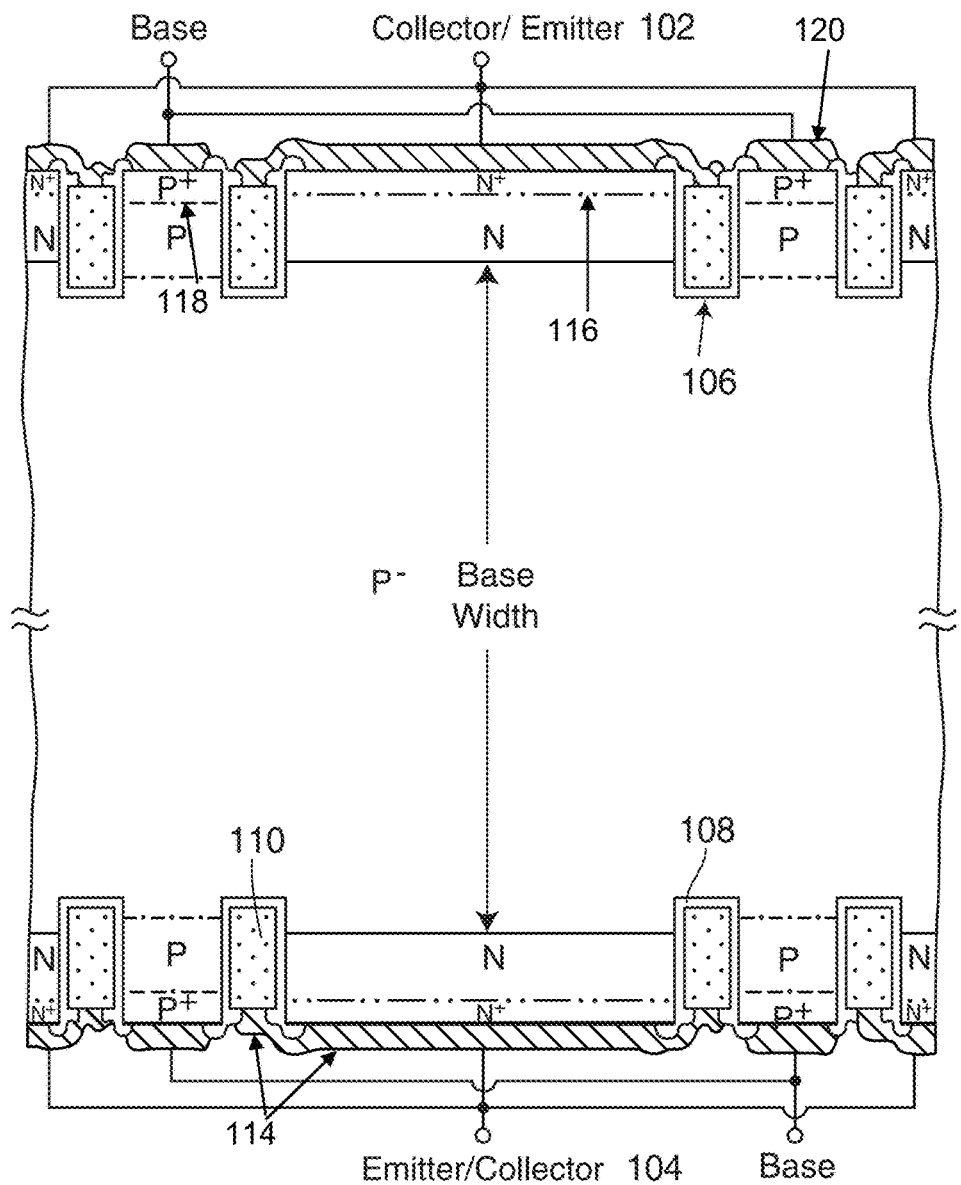
FIG. 1 schematically shows an exemplary B-TRAN having trenched field plates.
Figure 2:
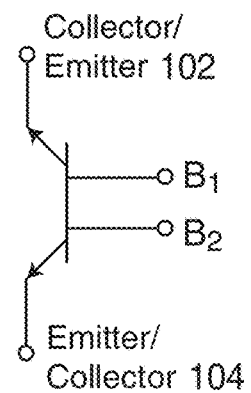
FIG. 2 shows the preferred circuit symbol for a B-TRAN-type device.

This reduction in device performance may be reduced or eliminated by the combination of dielectric layer 108 adjacent to the sidewall and bottom of trench 106, and field plate 110 (in the center of the trench) connected through common electrode 114 to n-type emitter/collector regions 116, as shown in FIG. 1.

The thickness of dielectric 108 must be chosen so the intensity of the electric field below the bottom of trench 106 is reduced to an acceptable level for the device being manufactured. However, simulations have shown that for a layer of silicon dioxide, a thickness in the range of 0.2 μm is sufficient for a device having a 1200 Volt breakdown.

Figure 4A:
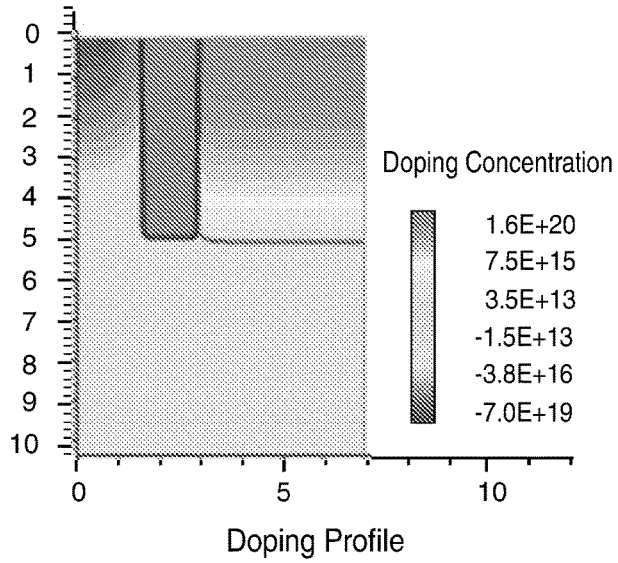
FIG. 4A shows an exemplary doping profile in a device like that of FIG. 1.
Figure 4B:
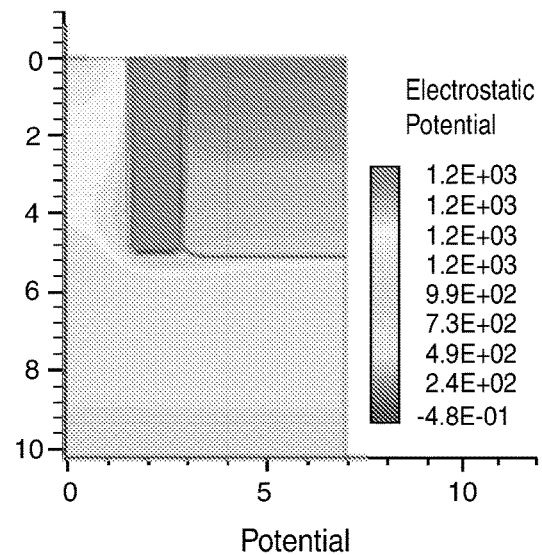
FIG. 4B shows the distribution of potential, in a device like that of FIG. 1, at breakdown.

The sample embodiment of FIG. 4A shows a doping profile for a device like that of FIG. 1 with 5-μm-deep trenches. This sample embodiment has a breakdown voltage of 1223 V, and an open c-base voltage of 1195.23 V. FIG. 4B shows an exemplary plot of potential at breakdown for a device like that simulated in FIG. 4A.

Figure 5A:
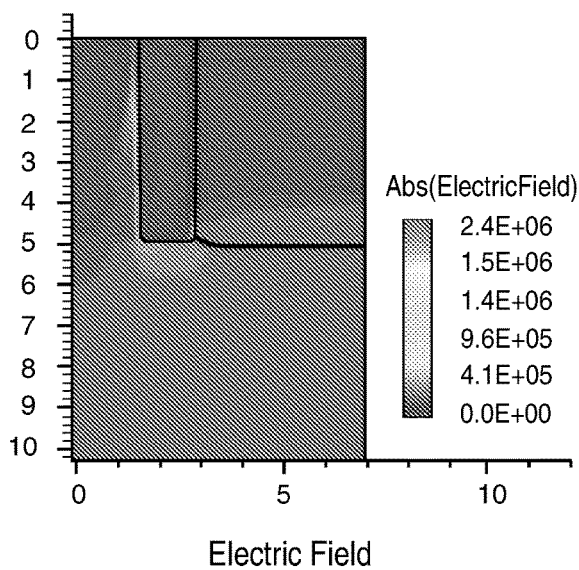
FIG. 5A shows the electric field, in a device like that of FIG. 1, at breakdown.
Figure 5B:
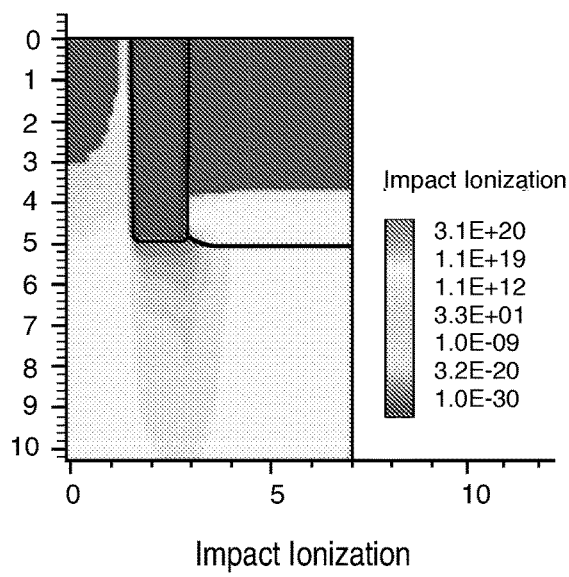
FIG. 5B shows impact ionization, in a device like that of FIG. 1, at breakdown.

In the sample embodiment of FIG. 5A, electric field at breakdown is simulated for a device like that of FIG. 1. Similarly, FIG. 5B simulates impact ionization at breakdown for an exemplary device like that simulated in FIG. 4A.

Figure 6:
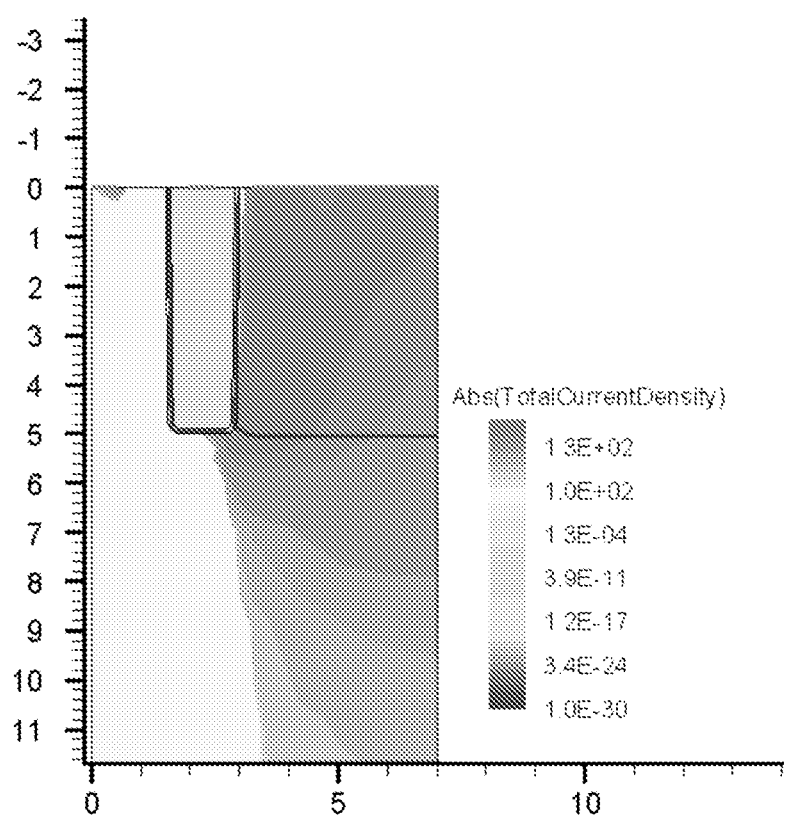
FIG. 6 shows the distribution of current density magnitude, in a device like that of FIG. 1, at breakdown.
Figure 7:
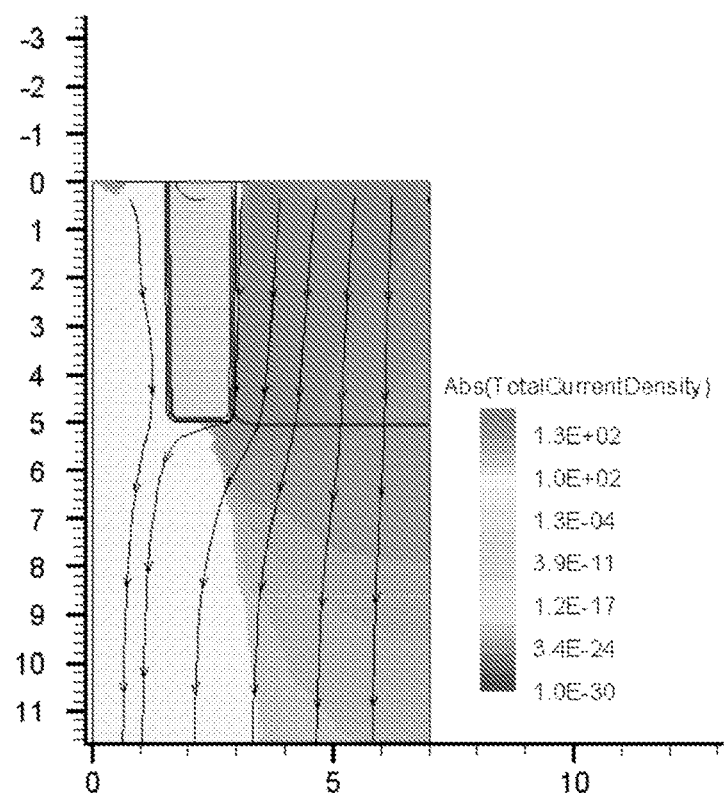
FIG. 7 shows a current density distribution plot, with current vectors indicated, for the upper side of a device like that of FIG. 1, at breakdown.
Figure 8:
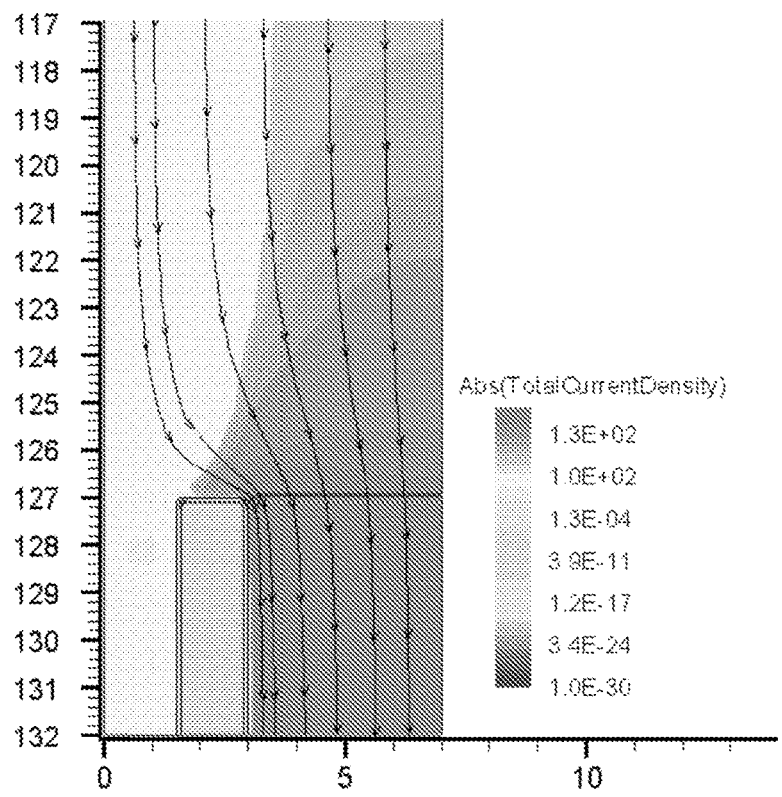
FIG. 8 shows a current density distribution plot, with current vectors indicated, like that of FIG. 6, at breakdown, for the lower side of a device like that of FIG. 1.

The sample embodiment of FIG. 6 plots the distribution of current density, near the emitter/collector region acting as a collector, at breakdown for a device like that of FIG. 1. The current density near the emitter is on the order of $I_E$=100 A/cm$^2$. The base-collector voltage is $V_{BC}$=0.7 V, and the collector-emitter voltage is $V_{CE}$=0.184 V. In the sample embodiment of FIG. 7, this current density distribution is supplemented by vectors showing the direction of current near the collector of a device like that of FIG. 1. Similarly, the sample embodiment of FIG. 8 shows current density distribution and current direction near the emitter of a device like that of FIG. 1.

Figure 9:
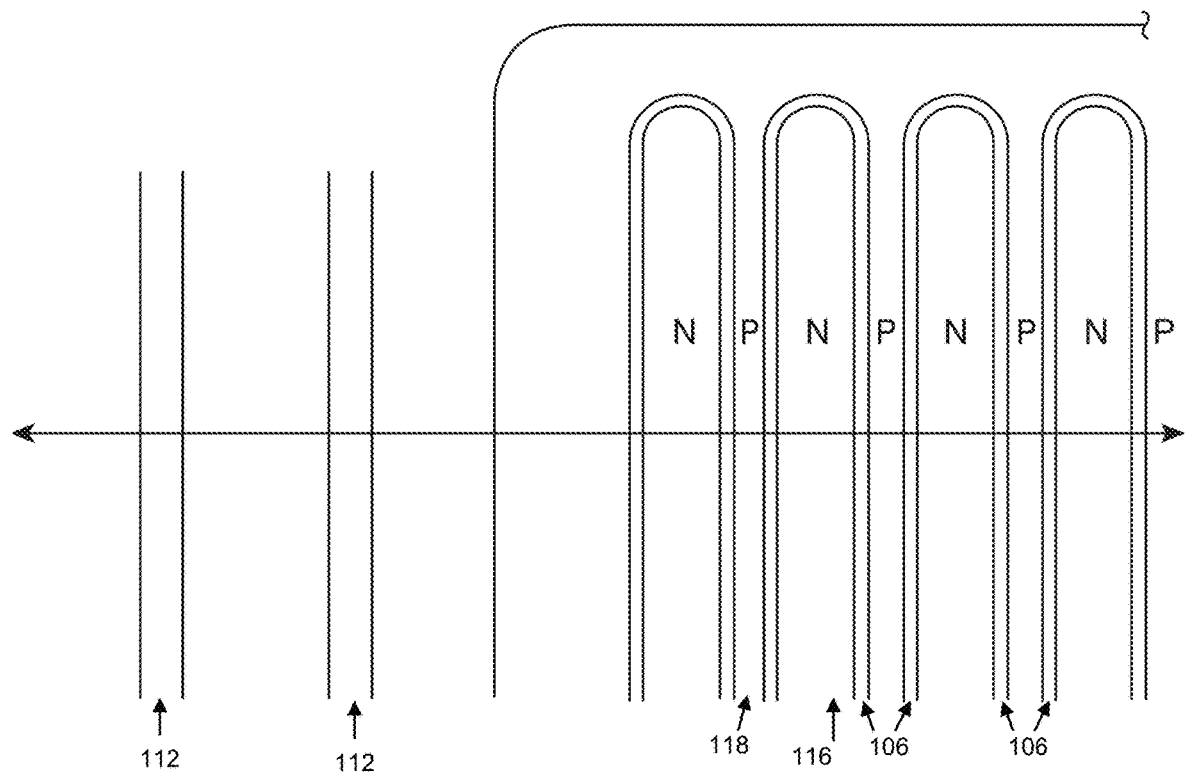
FIG. 9 shows a plan view of one surface of a device like that of FIG. 1, showing how the emitter/collector areas are laterally surrounded by vertical field plates.

FIG. 9 shows a plan view of one surface of a device like that of FIG. 1, showing how the emitter/collector areas are laterally surrounded by vertical field plates 110.

Figure 10:
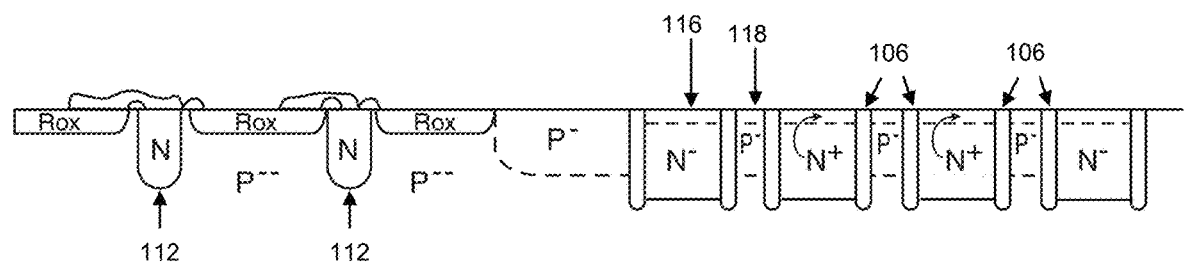
FIG. 10 is a partial cross-section of the periphery of a device like that of FIG. 1, showing doping profiles generally.

FIG. 10 is a partial cross-section of the periphery of a device like that of FIG. 1, showing doping profiles generally. Note that only two field-limiting rings 112 are shown in this example, but in practice the number of field-limiting rings 112 can be much larger, e.g. ten.

The active region contains emitter/collector regions 116, each of which is surrounded by a vertical field plate. There are base contact regions 118 (which are connected to common electrode 120) adjacent to the long edge of each emitter region.

From the edge of the active region to the edge of the die, the regions that are present are:

A field plate that surrounds the entire active region. It extends outward over the P− region at the edge of the active region, and into the region that has a thick field oxide region.

A series of about 10 field limiting rings (FLRs) consisting of a lightly doped n-type region diffused into the lightly doped p-type substrate. The FLRs have field plates to spread the depletion region.

An equipotential ring at the outer perimeter of the termination consisting of an aluminum ring that contacts a P+ region formed at the die edge.

In this example the dopings shown as n− (in the periphery) are preferably the same Phosphorus dopings as those used in the emitter/collector regions. The emitter/collector regions themselves also have a shallower n+ contact doping, which is not present in the n− periphery regions. This is preferably As (arsenic).

Similarly, in this example the dopings shown as p− (in the periphery) are preferably the same boron dopings as those used in the emitter/collector regions. The regions themselves also have a shallower p+ contact doping, which is not present in the n− periphery regions.

The p− doping is the bulk doping of the semiconductor die. This can be, for example, 180-250 ohm-cm for a 1200V part, 80-120 ohm-cm for a 600V part, and higher for higher rated voltages.

ADVANTAGES

The disclosed innovations, in various embodiments, provide one or more of at least the following advantages.

However, not all of these advantages result from every one of the innovations disclosed, and this list of advantages does not limit the various claimed inventions.

Increased breakdown voltage;
Increased ruggedness;
Better performance during turn-off; and
Improved device performance.

According to some but not necessarily all embodiments, there is provided: Dual-base two-sided bipolar power transistors which use an insulated field plate to separate the emitter/collector diffusions from the nearest base contact diffusion. This provides a surprising improvement in turn-off performance, and in breakdown voltage.

According to some but not necessarily all embodiments, there is provided: A power semiconductor device, comprising: first and second first-conductivity-type emitter/collector regions, located respectively on first and second surfaces of a second-conductivity-type semiconductor die having first and second surfaces; first and second second-conductivity-type base contact regions, located respectively on the first and second surface of the semiconductor die; first and second insulated field plate structures, located respectively on the first and second surface of the semiconductor die; wherein the field plate structures are conductive, and are vertically extended, and laterally adjoin the emitter/collector regions; wherein the first emitter/collector region is generally shaped like a stripe with sides and ends, and is laterally surrounded by the first insulated field plate structure at both sides and both ends, and is electrically connected to the first insulated field plate structure; and wherein the second emitter/collector region is generally shaped like a stripe with sides and ends, and is laterally surrounded by the second insulated field plate structure at both sides and both ends, and is electrically connected to the second insulated field plate structure; whereby the breakdown voltage is improved under either polarity of applied voltage.

According to some but not necessarily all embodiments, there is provided: A power semiconductor device, comprising: a p-type semiconductor die having first and second surfaces; first and second n-type emitter/collector regions, located respectively on the first and second surface of the semiconductor die; first and second p-type base contact regions, located respectively on the first and second surface of the semiconductor die; first and second trenched field plate structures, located respectively on the first and second surface of the semiconductor die; wherein the first emitter/collector region is electrically connected to, and is entirely surrounded by, the first trenched field plate structure; and wherein the second emitter/collector region is electrically connected to, and is entirely surrounded by, the second trenched field plate structure; whereby the breakdown voltage is improved under either polarity of applied voltage.

According to some but not necessarily all embodiments, there is provided: A power semiconductor device, comprising: an n-type semiconductor die having first and second surfaces; first and second p-type emitter/collector regions, located respectively on the first and second surface of the semiconductor die; first and second n-type base contact regions, located respectively on the first and second surface of the semiconductor die; first and second trenched field plate structures, located respectively on the first and second surface of the semiconductor die; wherein the first emitter/collector region is electrically connected to, and is entirely surrounded by, the first trenched field plate structure; and wherein the second emitter/collector region is electrically connected to, and is entirely surrounded by, the second trenched field plate structure; whereby the breakdown voltage is improved under either polarity of applied voltage.

According to some but not necessarily all embodiments, there is provided: A method for switching, comprising: in the ON state, driving base current through one, but not both, of first and second p-type base contact regions which are located on opposite faces of a p-type substrate, to thereby allow passage of current between first and second n-type emitter/collector regions which are also located on opposite faces of the p-type substrate; wherein the base contact regions and the emitter/collector regions are laterally separated, on both faces of the substrate, by a vertically extended conductive field plate which is laterally surrounded by dielectric material; and in the OFF state, reducing peak electric field near the emitter-base junctions by capacitive coupling between the insulated field plate and the volume of the die.

According to some but not necessarily all embodiments, there is provided: A method for switching, comprising: in the ON state, driving base current through one, but not both, of first and second n-type base contact regions which are located on opposite faces of a n-type substrate, to thereby allow passage of current between first and second p-type emitter/collector regions which are also located on opposite faces of the n-type substrate; wherein the base contact regions and the emitter/collector regions are laterally separated, on both faces of the substrate, by a vertically extended conductive field plate which is laterally surrounded by dielectric material; and in the OFF state, reducing peak electric field near the emitter-base junctions by capacitive coupling to the insulated field plate.

According to some but not necessarily all embodiments, there is provided: A method for switching a power bipolar semiconductor device which includes both an n-type emitter/collector region, and also a p-type base contact region, on both first and second surfaces of a p-type semiconductor die, comprising: during the ON state, driving base current into one of the base contact regions; and during transition to the OFF state, temporarily shorting the base contact region on the first surface to the emitter/collector region on the first surface, while also shorting the base contact region on the second surface to the emitter/collector region on the second surface, and thereafter floating at least the base contact region on the first surface; wherein the base contact region on the first surface is not connected to the base contact region on the second surface; wherein a trenched field plate separates each emitter/collector region from the respective base contact region; whereby currents of both polarities are controllably switched between the emitter/collector regions on opposite surfaces.

According to some but not necessarily all embodiments, there is provided: A switching circuit comprising: a two-base bidirectional npn semiconductor device which includes both n-type emitter/collector regions, and also p-type base contact regions, on both opposed surfaces of a p-type monolithic semiconductor die; control circuitry which is connected separately to the first and second base contact regions on the opposed surfaces; first and second distinct clamp circuits, each comprising a series combination of a low-voltage diode and a normally-on switch, connected so that, when the normally-on switch is on, the anode of the low-voltage diode is connected to the p-type base contact region, and the cathode of the low-voltage diode is connected to the n-type emitter/collector region; and insulated field plate structures in trenches separating each emitter/collector region from adjacent base contact regions; wherein the low-voltage diode turns on at a forward voltage which is less than the diode drop of the p-n junction between an emitter/collector region and the semiconductor die; whereby, when the normally-on switch is ON, the p-n junction between an emitter/collector region and the semiconductor die cannot ever be forward biased.

According to some but not necessarily all embodiments, there is provided: A method for switching a power semiconductor device which includes both an n-type emitter/collector region, and also a p-type base contact region, on both first and second surfaces of a p-type semiconductor die, comprising: in the ON state, flowing base current through the base contact region which is nearer the more positive one of the emitter/collector regions, without flowing base current through the other of the base contact regions; wherein the base contact region on the first surface is not electrically connected to the base contact region on the second surface, except through the semiconductor die itself; wherein the emitter/collector region on the first surface is not electrically connected to the emitter/collector region on the second surface; and wherein a trenched field plate separates each emitter/collector region from the respective base contact region; whereby bidirectional switching is achieved with low on-state voltage drop and reliable turn-off.

According to some but not necessarily all embodiments, there is provided: A method for switching a power semiconductor device which includes both an n-type emitter/collector region, and also a p-type base contact region, on both first and second surfaces of a p-type semiconductor die, comprising: at turn-on, shorting the more positive one of the emitter/collector regions together with the base contact region on the same one of the surfaces, to thereby conduct current with a diode voltage drop; and thereafter flowing base current through at least one of the base contact regions, to initiate conduction as a bipolar transistor with less than a diode voltage drop; wherein the base contact region on the first surface is not electrically connected to the base contact region on the second surface, except through the semiconductor die itself; wherein a trenched field plate separates each emitter/collector region from the corresponding base contact region; whereby bidirectional switching is achieved with low on-state voltage drop and reliable turn-off.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

In the above example the semiconductor die is silicon, but other semiconductor materials can be used instead.

The field plate is preferably made of doped polysilicon, but other conductive materials, such as aluminum or tungsten, can also be used.

The insulation around the field plate is preferably thick enough to withstand the large voltage drop seen at the collector side in the off state. Moreover, the insulation around the field plate can be more robust, if desired.

Preferably the insulation around the field plate is provided by a thin layer of silicon dioxide which is grown on the sidewalls of a trench etched into the (silicon) die. However, this layer of insulation can alternatively include multiple different materials.

Additional general background, which helps to show variations and implementations, can be found in the following publications, all of which are hereby incorporated by reference: U.S. Pat. Nos. 9,029,909, 9,035,350, 9,054,706, 9,054,707, 9,059,710.

Additional general background, which helps to show variations and implementations, as well as some features which can be implemented synergistically with the inventions claimed below, may be found in the following US patent applications. All of these applications have at least some common ownership, copendency, and inventorship with the present application, and all of them, as well as any material directly or indirectly incorporated within them, are hereby incorporated by reference: US 2015-0214055 A1, US 2015-0214299 A1, US 2015-0270771 A1, US 2015-0270837 A1, US 2015-0280613 A1; PCT/US14/43962, PCT/US14/69611, PCT/US15/11827; Ser. Nos. 14/755,065, 14/791,977, 14/792,262; and all priority applications of any of the above thereof, each and every one of which is hereby incorporated by reference.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A power semiconductor device, comprising:
    first and second first-conductivity-type emitter/collector regions, located respectively on first and second surfaces of a second-conductivity-type semiconductor die;
    first and second second-conductivity-type base contact regions, located respectively on the first and second surface of the semiconductor die;
    first and second entrenched field plate structures, located respectively on the first and second surface of the semiconductor die; wherein the entrenched field plate structures are conductive, and are insulated from the bulk of the semiconductor die, and are vertically extended, and laterally adjoin the emitter/collector regions, and also laterally adjoin the base contact regions;
    wherein, on each of the surfaces, an emitter/collector region and a base contact region are separated by an entrenched field plate structure, the entrenched field plate structure adjoining both the emitter/collector region and also the base contact region;
    wherein the first and second emitter/collector regions, and also the first and second base contact regions, are each connected to a respectively corresponding external connection; and
    first and second field-limiting ring structures, located respectively on the first and second surfaces of the die; wherein the first field-limiting ring structure laterally surrounds the first emitter/collector region, the first entrenched field plate structure, and the first base contact region; and wherein the second field-limiting ring structure laterally surrounds the second emitter/collector region, the second entrenched field plate structure, and the second base contact region;
    whereby the breakdown voltage is improved under either polarity of applied voltage.

2. The device of claim 1, wherein the first conductivity type is n-type.

3. The device of claim 1, wherein the semiconductor die is silicon.

4. The device of claim 1, wherein the insulated field plate structures comprise doped polysilicon field plates inside oxide-lined trenches.

5. The device of claim 1, wherein the first conductivity type is p-type.

6. The device of claim 1, further comprising a plurality of first additional field-limiting ring structures which laterally surround the first field-limiting ring structure, and also comprising a plurality of second additional field-limiting ring structures which laterally surround the second field-limiting ring structure.

7. The device of claim 6, wherein the plurality of first additional field-limiting ring structures includes at least nine such structures, and the plurality of second additional field-limiting ring structures includes at least nine such structures.

8. The device of claim 1, wherein the first emitter/collector region is directly electrically connected to the first entrenched field plate structure through a first common electrode, and wherein the second emitter/collector region is directly electrically connected to the second entrenched field plate structure through a second common electrode.

9. The device of claim 6, wherein the additional field-limiting ring structures include a plurality of first-conductivity-type doped regions, laterally separated from each other by a plurality of insulating regions.

10. The device of claim 9, wherein the insulating regions in the field-limiting ring structures are silicon dioxide.

11. The device of claim 6, wherein the field-limiting ring structures each include a plurality of first-conductivity-type doped regions, laterally separated from each other by a plurality of insulating regions; and wherein the doping profile of the lower parts of the first-conductivity-type doped regions in the field-limiting ring structures is generally the same as that in the lower parts of the emitter/collector regions.

* * * * *